United States Patent
Zhang et al.

(10) Patent No.: US 10,886,216 B2
(45) Date of Patent: Jan. 5, 2021

(54) ELECTRIC FUSE STRUCTURE FOR OPTIMIZING PROGRAMMING CURRENT WINDOW OF THE ELECTRIC FUSE STRUCTURE AND MANUFACTURING METHOD

(71) Applicant: Shanghai Huali Integrated Circuit Mfg. Co., Ltd., Shanghai (CN)

(72) Inventors: Yanwei Zhang, Shanghai (CN); Runling Li, Shanghai (CN); Tianpeng Guan, Shanghai (CN)

(73) Assignee: SHANGHAI HUALI INTEGRATED CIRCUIT MFG. CO., LTD., Shanghai (CN)

( * ) Notice: Subject to any disclaimer, the term of this patent is extended or adjusted under 35 U.S.C. 154(b) by 0 days.

(21) Appl. No.: 16/192,820

(22) Filed: Nov. 16, 2018

(65) Prior Publication Data

US 2020/0035600 A1    Jan. 30, 2020

(30) Foreign Application Priority Data

Jul. 27, 2018   (CN) .......................... 2018 1 0842465

(51) Int. Cl.
| | |
|---|---|
| *H01L 21/82* | (2006.01) |
| *H01L 23/52* | (2006.01) |
| *H01L 23/525* | (2006.01) |
| *H01L 21/265* | (2006.01) |
| *H01L 21/762* | (2006.01) |
| *H01L 21/8238* | (2006.01) |

(52) U.S. Cl.
CPC .... *H01L 23/5256* (2013.01); *H01L 21/26513* (2013.01); *H01L 21/76224* (2013.01); *H01L 21/823814* (2013.01)

(58) Field of Classification Search
CPC .......... H01L 23/5256; H01L 21/26513; H01L 21/76224; H01L 21/823814
USPC ........ 257/529; 438/132, 215, 281, 333, 467, 438/601
See application file for complete search history.

(56) References Cited

U.S. PATENT DOCUMENTS

| | | | | |
|---|---|---|---|---|
| 5,708,291 A | * | 1/1998 | Bohr .................... | H01L 23/5256 257/529 |
| 6,469,363 B1 | * | 10/2002 | Delpech .............. | H01L 23/5256 257/529 |

(Continued)

*Primary Examiner* — Didarul A Mazumder
(74) *Attorney, Agent, or Firm* — Kilpatrick Townsend & Stockton, LLP (57) ABSTRACT

The present disclosure provides an electric fuse structure and a manufacturing method therefor, the manufacturing method including providing a substrate, forming a polysilicon corresponding to the electric fuse structure on the substrate, performing a source-drain ion implantation of a first doping type on the polysilicon, performing a source-drain ion implantation of a second doping type on the polysilicon, the first doping type being different from the second doping type, and forming a metal salicide on the surface of the doped polysilicon. The electric fuse structure manufactured according to the manufacturing method provided in the present disclosure has a high post-value resistance, so that a programming current window is effectively optimized, and the manufactured electric fuse structure has a uniform internal interface and good electrical characteristics.

18 Claims, 3 Drawing Sheets

(56) References Cited

U.S. PATENT DOCUMENTS

| | | | | |
|---|---|---|---|---|
| 6,911,360 B2* | 6/2005 | Li | ............... | H01L 23/5256 |
| | | | | 257/379 |
| 8,101,977 B2* | 1/2012 | Church | ............... | H01L 23/5256 |
| | | | | 257/209 |
| 8,598,680 B2* | 12/2013 | Yonezu | ............... | H01L 23/5256 |
| | | | | 257/529 |
| 2005/0214982 A1* | 9/2005 | Wu | ............... | H01L 27/1203 |
| | | | | 438/149 |
| 2005/0285224 A1* | 12/2005 | Tsutsui | ............... | H01L 23/5256 |
| | | | | 257/531 |
| 2009/0109725 A1* | 4/2009 | Schulte | ............... | H01L 27/112 |
| | | | | 365/96 |
| 2009/0140382 A1* | 6/2009 | Gao | ............... | H01L 23/5256 |
| | | | | 257/529 |
| 2010/0181643 A1* | 7/2010 | Kothandaraman | ............... | |
| | | | | H01L 23/5256 |
| | | | | 257/529 |
| 2011/0175199 A1* | 7/2011 | Lin | ............... | H01L 29/0646 |
| | | | | 257/605 |
| 2011/0248379 A1* | 10/2011 | Yonezu | ............... | H01L 23/5256 |
| | | | | 257/529 |
| 2013/0056846 A1* | 3/2013 | Takeda | ............... | H01L 21/02164 |
| | | | | 257/529 |
| 2013/0082347 A1* | 4/2013 | Chen | ............... | H01L 23/5256 |
| | | | | 257/529 |

\* cited by examiner

ELECTRIC FUSE STRUCTURE FOR OPTIMIZING PROGRAMMING CURRENT WINDOW OF THE ELECTRIC FUSE STRUCTURE AND MANUFACTURING METHOD

CROSS-REFERENCES TO RELATED APPLICATIONS

The present application claims priority to Chinese Patent Application No. 201810842465.X, filed on Jul. 27, 2018, entitled "ELECTRIC FUSE STRUCTURE AND MANUFACTURING METHOD THEREFOR", which is incorporated by reference herein for all purposes.

FIELD

The present disclosure relates to a semiconductor device and a manufacturing process and, particularly, to an electric fuse structure and a manufacturing method therefor.

BACKGROUND OF THE DISCLOSURE

Since the disclosure of integrated circuits by Dr. Jack Kilby of Texas Instruments in early years, scientists and engineers have made numerous disclosures and improvements in semiconductor devices and processes. Over 50 years, the size of semiconductors have been significantly reduced, which translates into an increasing processing speed and decreasing power consumption. To date, the development of semiconductors has largely followed Moore's Law, which roughly states that the number of transistors in dense integrated circuits doubles about every two years. At present, semiconductor processes are developing toward below 20 nm, and some companies are embarking on 14 nm processes.

With the evolution of integrated circuit developments, the functional densities (for example, the number of interconnects per chip region) are also generally increasing as geometries (that is, the smallest elements or lines that can be produced using a process) are reduced. This downsizing process can typically offer benefits by increasing productivity and decreasing related costs, but the downsizing leads to more and more complex manufacturing processes for semiconductor devices, and the semiconductor devices are increasingly susceptible to various defects and impurities, failure of a single metal line, diode or transistor often constitutes a defect of an entire chip. Therefore, it becomes more and more important to form some fuses of which the resistance can be greatly changed (changed from a low resistance state to a high resistance state) or connecting lines that can be fused in an integrated circuit. The fuse is used to connect redundant circuits in the integrated circuit, and once the integrated circuit is found to be defective through detection, a defective circuit can be repaired or replaced with the fuse. The fusible connecting line designed to repair the defective circuit can improve the yield of the integrated circuit chips, in addition to the application in redundant circuits, the fuse structure also has a wider range of applications, such as build in self-test (BIST) technology, self-repairing technology, one time program (OTP) chip, system on chip (SoC).

At present, the commonly used fuse is an electric fuse, the principle of which is to use the principle of electro-migration to cause the fuse to be fused by passing a large instantaneous current through the fuse, that is, to achieve the fuse of the electric fuse by programming the electric fuse. However, for the electric fuse, there is a strict requirement for programming current for driving the electro-migration of the electric fuse, and therefore there is an urgent need for an electric fuse structure capable of optimizing a programming current window of an electric fuse and a manufacturing method therefor.

BRIEF SUMMARY OF THE DISCLOSURE

As described above, in order to optimize a programming current window of an electrical fuse structure, the present disclosure provides a manufacturing method for an electric fuse structure, comprising: providing a substrate; forming a polysilicon corresponding to the electric fuse structure on the substrate; performing a source-drain ion implantation of a first doping type on the polysilicon; performing a source-drain ion implantation of a second doping type on the polysilicon, the first doping type being different from the second doping type; and forming a metal salicide on the surface of the doped polysilicon.

The manufacturing method as described above, the concentration of the source-drain ion implantation of the first doping type is equivalent to the concentration of the source-drain ion implantation of the second doping type, so as to neutralize the source-drain ion implantations of the first doping type and the second doping type.

The manufacturing method as described above, the concentration of the source-drain ion implantation of the first doping type and the concentration of the source-drain ion implantation of the second doping type are both in the range of 10E14-10E15.

The manufacturing method as described above, the first doping type is an N-type, and the second doping type is a P-type.

The manufacturing method as described above, the first doping type is a P-type and the second doping type is an N-type.

The manufacturing method as described above, a CMOS structure is also formed on the substrate, the CMOS structure being located on the substrate outside an area of the electric fuse structure; source-drain ions of the first doping type are implanted in the same step as that of source-drain ions of the first doping type of the CMOS structure; and source-drain ions of the second doping type are implanted in the same step as that of source-drain ions of the second doping type of the CMOS structure.

The manufacturing method as described above, further comprising forming a shallow trench isolation on the substrate, and the polysilicon is formed on the shallow trench isolation.

The manufacturing method as described above, the electric fuse structure comprises an anode, a cathode, and an electric fuse body connecting the anode and the cathode, the step of forming the polysilicon further comprising: depositing a polysilicon layer on the surface of the substrate; patterning the polysilicon layer corresponding to the anode, the cathode, and the electric fuse body; and etching the patterned polysilicon layer to form the polysilicon corresponding to the electric fuse structure.

The manufacturing method as described above, the manufacturing method further comprises: forming several contact holes in the anode and the cathode, respectively.

The manufacturing method as described above, the metal salicide is formed on the surface of the polysilicon using a self-aligned salicide process.

The present disclosure further provides an electric fuse structure manufactured using any one of the manufacturing methods described above.

According to the electric fuse structure and the manufacturing method therefor provided in the present disclosure, a post-value resistance of an electric fuse can be effectively increased, and a programming current window of the electric fuse structure is optimized. Moreover, in the doped electric fuse structure, the growth is uniform between interfaces, so that the electrical characteristics are stable.

REFERENCE NUMERALS

110 Shallow trench isolation STI
120 Polysilicon
130 Metal salicide
140 Contact etch stop layer CESL
150 Contact hole
210 Shallow trench isolation STI
220 Polysilicon
230 Metal salicide
240 Contact etch stop layer CESL
250 Contact hole
300 Electric fuse structure
310 Fuse body
321 Anode
322 Cathode
330 Contact hole
400 Mask

DETAILED DESCRIPTION OF THE DISCLOSURE

The present disclosure relates to a semiconductor process and device. More specifically, an embodiment of the present disclosure provides a manufacturing method for an electric fuse structure, and the manufacturing method for an electric fuse structure comprises: performing a source-drain ion implantation of an N-type and a source-drain ion implantation of a P-type on the polysilicon in an electric fuse structure. The present disclosure also provides other embodiments.

The reader is cautioned as to all files and documents which are filed at the same time as this specification and which are open for the public to consult, and the contents of all such files and documents are incorporated herein by reference. Unless directly stated otherwise, all features disclosed in this specification (including any appended claims, the abstract, and the accompanying drawings) may be replaced by other features serving the same, equivalent, or similar purpose. Therefore, unless expressly stated otherwise, each feature disclosed is only one example of a group of equivalent or similar features.

Furthermore, an apparatus that is not expressly indicated in the claims as being used for performing a particular function, or any component as being used for performing a step of a particular function, should not be construed as a means or step provision as specified in 35 USC Section 112, Paragraph 6. In particular, the use of "step of . . . " or "action of . . . " in the claims herein does not indicate relating to the specifications in 35 USC § 112, Paragraph 6.

Note that when used, the flags left, right, front, back, top, bottom, front, back, clockwise, and counter-clockwise are used for convenience purposes only and do not imply any fixed direction. In fact, they are used to reflect the relative position and/or direction between various parts of an object.

As used herein, the terms "over . . . ", "under . . . ", "between . . . and . . . ", and "on . . . " means the relative position of that layer relative to another layer. Likewise, for example, a layer that is deposited or placed over or under another layer may be in direct contact with another layer or there may be one or more intervening layers. In addition, a layer that is deposited or placed between layers may be in direct contact with the layers or there may be one or more intervening layers. In contrast, a first layer "on" a second layer is in contact with the second layer. In addition, a relative position of a layer relative to another layer is provided (assuming that film operations of deposition, modification, and removal are performed in relative to a starting substrate, without considering the absolute orientation of the substrate).

As mentioned above, the manufacturing of the semiconductor device has become increasingly challenging and advancing toward the physically possible limit. With the evolution of integrated circuit developments, the functional densities (for example, the number of interconnects per chip region) are also generally increasing as geometries (that is, the smallest elements or lines that can be produced using a process) are reduced. This downsizing process can typically offer benefits by increasing productivity and decreasing related costs, however, the downsizing leads to more and more complex manufacturing processes for semiconductor devices, and the semiconductor devices are increasingly susceptible to various defects and impurities, failure of a single metal line, diode or transistor often constitutes a defect of an entire chip. Therefore, it becomes more and more important to form some fuses of which the resistance can be greatly changed (changed from a low resistance state to a high resistance state) or connecting lines that can be fused in an integrated circuit. The fuse is used to connect redundant circuits in the integrated circuit, and once the integrated circuit is found to be defective through detection, a defective circuit can be repaired or replaced with the fuse. The fusible connecting line designed to repair the defective circuit can improve the yield of the integrated circuit chips, in addition to the application in redundant circuits, the fuse structure also has a wider range of applications, such as build in self-test (BIST) technology, self-repairing technology, one time program (OTP) chip, system on chip (SoC).

At present, the commonly used fuse is an electric fuse, the principle of which is to use the principle of electro-migration to cause the fuse to be fused by passing a large instantaneous current through the fuse, that is, to achieve the fuse of the electric fuse by programming the electric fuse. A commonly used electric fuse is formed on a substrate, especially on a shallow trench isolation (STI) of the substrate, and the electric fuse generally has a two-layer structure, that is, containing a metal salicide on the top and a polysilicon.

Above the metal salicide, there are contact holes located in the cathode and the anode to extract the electric fuse, and the contact holes are separated by a contact etch stop layer (CESL).

The fuse resistance value of the electric fuse structure is determined by the metal salicide located on the top before electro-migration occurs, and generally, the metal salicide on the top has a very low resistance value of about 100-200 ohms. When electro-migration occurs in the fuse body region, electrons in the metal salicide migrate, and therefore the post-value resistance of the electric fuse after the occurrence of electro-migration is determined by the polysilicon at the bottom. In order to expand the range of programming current, it is desired to maintain the post-resistance value of the electric fuse in a high numerical range, the resistance value of the polysilicon at the bottom is required to be greater than 5000 ohms, thereby optimizing a programming current window.

Accordingly, the present disclosure provides an electric fuse structure and a manufacturing method therefor, which can ensure that the electric fuse has a large post-value resistance value to optimize the programming current.

Figure 1:
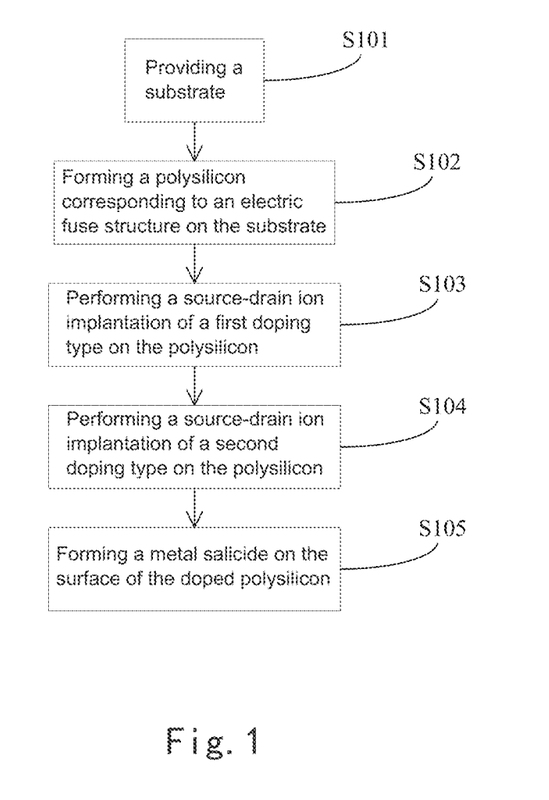
FIG. 1 shows a flow chart of a manufacturing method for an electric fuse structure provided in the present disclosure.

FIG. 1 shows a flow chart of a manufacturing method for an electric fuse structure provided in the present disclosure. As shown in FIG. 1, step S101 is performed to provide a semiconductor substrate used in the present disclosure, and the substrate may be a semiconductor wafer such as a silicon wafer. In some embodiments, the substrate may include an elemental semiconductor material, a compound semiconductor material, and/or an alloy semiconductor material. Examples of elemental semiconductor materials may be, but are not limited to, crystalline silicon, polysilicon, amorphous silicon, germanium, and/or diamond. Examples of compound semiconductor materials may be, but not limited to, silicon carbide, gallium arsenide, gallium phosphide, indium phosphide, indium arsenide, and/or indium antimonide. Examples of alloy semiconductor materials may be, but not limited to, SiGe, GaAsP, AlInAs, AlGaAs, GaInAs, GaInP, and/or GaInAsP.

In one embodiment, the method provided in the present disclosure comprises: forming a shallow trench isolation on the semiconductor substrate. The shallow trench isolation process (STI) includes, but is not limited to, shallow trench etching, oxide filling, and oxide planarization. Among these, the shallow trench etching includes but is not limited to isolating an oxide layer, depositing a nitride, performing shallow trench isolation with a mask and performing STI shallow trench etching. Among these, the STI oxide fill includes but is not limited to trench liner silicon oxide, trench CVD (chemical vapor deposition) oxide fill or PVD (physical vapor deposition) oxide fill. Among these, the planarization of the silicon surface can be implemented by means of various methods. The planarization of the silicon wafer can be implemented by using SOG (spin-on-glass) filling gaps, and the SOG can be formed of 80% solvent and 20% silicon dioxide, and after the deposition, the SOG is baked, the solvent is evaporated off, and the silicon dioxide is remained in the gaps, and it is also possible to conduct backcut of the entire surface to reduce the thickness of the entire wafer. The planarization treatment can also be effectively performed through a CMP process (also referred to as a polishing process) including, but not limited to, polishing a trench oxide (chemical mechanical polishing can be used) and removing nitride.

After the shallow trench isolation is formed, step S102 is performed to deposit polysilicon on the shallow trench isolation, and back etch the deposited polysilicon layer to form the polysilicon corresponding to the electric fuse structure. Forming the polysilicon corresponding to electric fuse structure mainly includes a photolithography patterning process, and may include photoresist coating (e.g., spin coating), soft baking, mask alignment, exposure, post-exposure baking, development photoresist, rinsing, drying (e.g., hard baking) and/or other suitable processes. The back-etching process may include dry etching, wet etching, and/or other etching methods (such as reactive ion etching).

Figure 4:
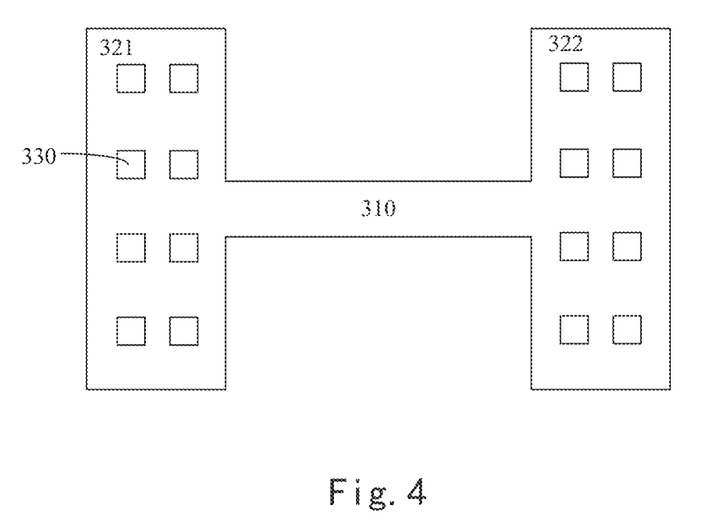
FIG. 4 shows a schematic top view of an electric fuse structure provided according to the present disclosure.

In one embodiment, the electric fuse structure provided in the present disclosure includes an electric fuse body, a cathode, and an anode. FIG. 4 shows a schematic top view of an electric fuse structure provided in the present disclosure. As shown in FIG. 4, one end of an electric fuse body 310 is electrically connected to an anode 321 and the other end is electrically connected to a cathode 322, and the fuse structure shown in FIG. 4 is an "H" type structure, while in another embodiment, the electric fuse structure may also be a "wine glass type" structure. In some embodiments, corresponding to the designed electric fuse structures of different shapes, the polysilicon layer is etched as the polysilicon of the corresponding shape.

The polysilicon formed according to the above steps has a high resistance value, with the resistance of an order of 10E4, and a large programming current window, which may already meet the requirement of optimizing the programming current window. However, the polysilicon formed by the above steps is not ion-doped, and in the subsequent step of forming the metal salicide, an interface between the polysilicon and the metal salicide is not uniform and is not flat, resulting in device defects and affecting the electrical characteristics of the device.

Figure 2:
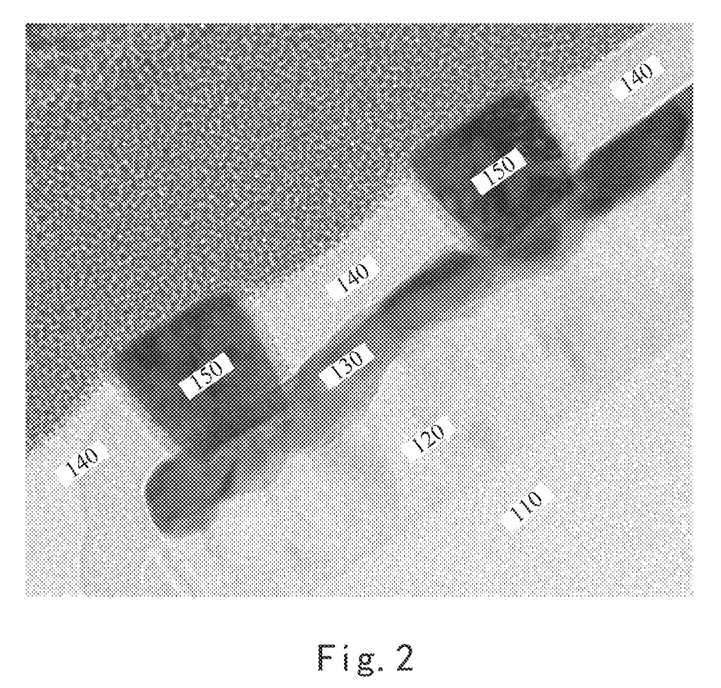
FIG. 2 shows a sectional view of an electric fuse structure without being doped with ion implantation under a transmission electron microscope.

FIG. 2 shows a structural diagram of an undoped electric fuse device. As shown in FIG. 2, an electric fuse structure is formed on a substrate having a shallow trench isolation 110, and the electric fuse has a two-layer structure including the metal salicide 130 on the top and polysilicon 120, the polysilicon 120 here being not ion doped. Above the metal salicide 130, there are contact holes 150 located in a cathode and a anode to extract the electric fuse, and the contact holes are separated by a contact etch stop layer 140. As can be seen from FIG. 2, the interface between the polysilicon 120 and the metal salicide 130 is rough and not flat due to undoping, which in turn affects the electrical characteristics of the device, resulting in device defects and a decrease in yield.

In order to make the internal interface of the electric fuse structure to be flat and ensure the yield of the electric fuse structure, the method provided in the present disclosure further comprises: performing steps S103 and S104, doping the polysilicon, and performing two opposite types of doping on the polysilicon, and, the polysilicon may be first doped with N-type ions, and may be doped with arsenic (As), phosphorus (P), other group V elements or a combination thereof. The polysilicon doped with the N-type ions is then doped with P-type ions, and may be doped with boron (B) or other group III elements. In another embodiment, the undoped polysilicon may be first doped with P-type ions, and may be doped with boron (B) or other group III element, and the polysilicon doped with the P-type ions is then doped with N-type ions, and may be doped with arsenic (As), phosphorus (P), other group V elements, or a combination thereof.

Figure 5:
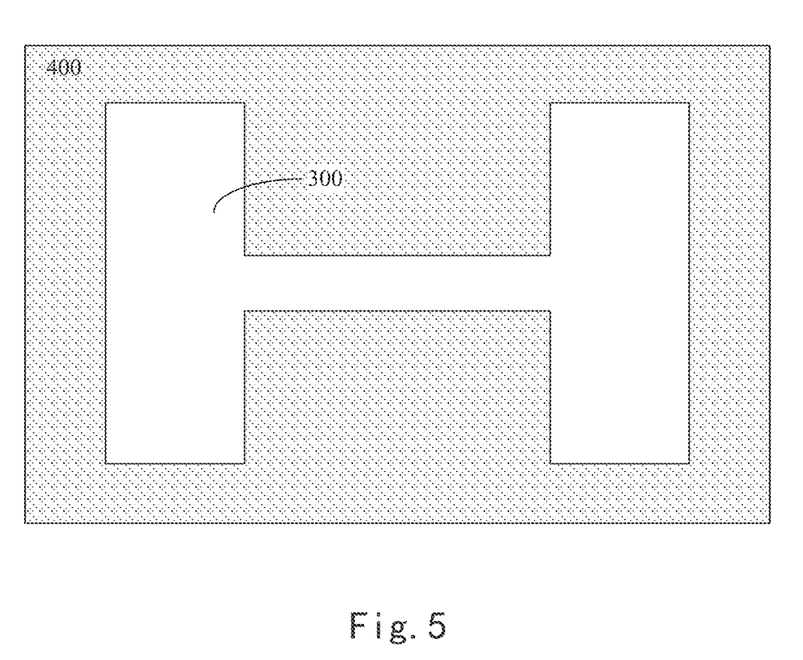
FIG. 5 shows a schematic view of a mask of an electric fuse structure provided according to the present disclosure.

Since ion implantations of different types are performed twice for the same polysilicon, regions of ion implantation have the same shape, and the shapes of a photomask used in performing steps S103 and S104 corresponding to electric fuse structure are also the same. FIG. 5 shows a schematic view of a mask of an electric fuse structure provided according to the present disclosure. As shown in FIG. 5, the electrical fuse structure 300 is polysilicon that needs to be doped, and is ensured to be doped in the correct position via the mask 400.

For the doped polysilicon, the internal grain size is smaller than that of the undoped polysilicon, and therefore the growth of the metal salicide on the doped polysilicon can effectively overcome the growth of the metal silicide is not flat, and can alleviate the smooth and flat problems of the internal interface of the electric fuse structure.

Figure 3:
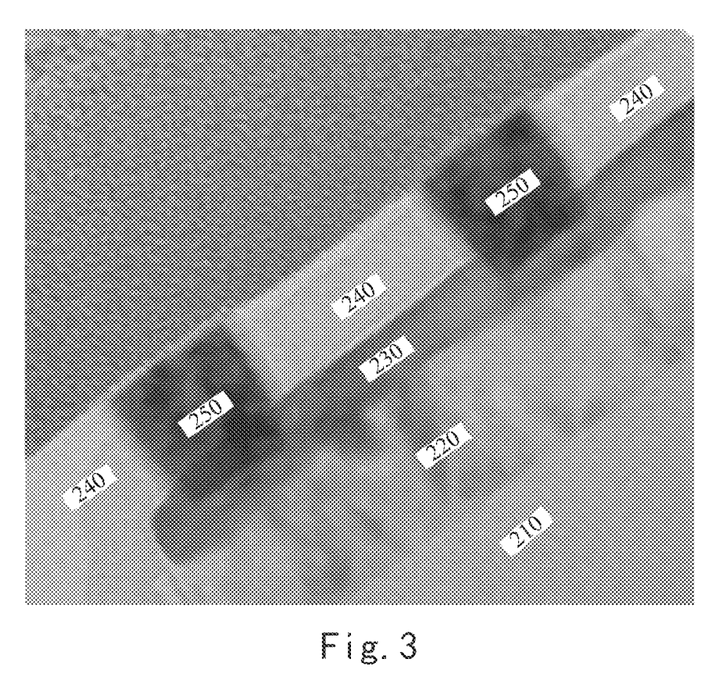
FIG. 3 shows a sectional view of an electric fuse structure provided according to the present disclosure under a transmission electron microscope.

FIG. 3 shows a sectional view of an electric fuse manufactured using the method provided in the present disclosure under a transmission electron microscope, and it can be seen that the electric fuse is formed on a substrate, particularly on a shallow trench isolation 210 of the substrate, and the electric fuse has a two-layer structure, that is, a metal salicide 230 on the top and a polysilicon 220, the polysilicon 220 here being doped with N-type and P-type ion implantations. Above the metal salicide 230, there are contact holes 250 located in a cathode and a anode to draw the electric fuse, and the contact holes are separated by a contact etch stop layer 240. It can be seen from FIG. 3 that in the electrical fuse structure formed according to the method provided in the present disclosure, an interface between the polysilicon 220 doped with the N-type and P-type ion implantations and the metal salicide 230 is flat, smooth, and uniform.

Although ion doping of the polysilicon can effectively alleviate the problem of interface between polysilicon and metal silicide that is not flat, but if only a single type of ion doping is performed on the polysilicon, the resistance value of the doped polysilicon is greatly reduced, thereby causing that the post-value resistance after the electrical fuse is fused does not reach a high requirement, resulting in a small range of programming current window of the electric fuse structure. In one embodiment, for the polysilicon on which only a single type of ion doping is performed, the square resistance is (generally) 600-800 ohms, and if the post-value resistance after the electrical fuse is fused is required to be greater than 5000 ohms, the length L of a region of the electrical fuse where electro-migration occurs is at least 8 times the width of this region, resulting in a strict requirement for programming current that drives electro-migration of the electric fuse.

In order to solve the above problems, to ensure that the internal interface of the electric fuse structure is flat and smooth while optimizing the programming current window of the electric fuse, the present disclosure not only performs ion doping on the polysilicon, but also performs two types of ion implantations on the polysilicon which constitute the electric fuse to neutralize both types of ions, such that even the polysilicon has been doped, its resistance is close to that of the undoped polysilicon. The doped polysilicon has a resistance of an order of 10E4, which effectively increases the post-resistance value of the electric fuse structure and optimizes the programming current window.

In order to effectively increase the post-resistance value of the electric fuse structure, in steps S103 and S104, when performing two opposite types of ion implantations on the polysilicon, it is necessary to pay attention to the concentration of implanted ions so that two types of ions with opposite electric characteristics are effectively neutralized. The most effective way is to set the concentration of the N-type ion implantation to be equivalent to the concentration of the P-type ion implantation. In some embodiments, the concentration of the ion implantation is of a great order, and therefore it is difficult to accurately control the concentrations of both ion implantations to be identical. According to the manufacturing method provided in the present disclosure, the concentrations of both ion implantations are made to be in an equivalent, comparable quantity range, so that the effect of neutralizing most of the two different ions can be achieved.

In one embodiment, it can be defined that the concentrations of both the two different types of ion implantations are in the range of 10E14-10E15, such that the N-type ions and the P-type ions are effectively mutually neutralized.

According to the method provided in the present disclosure, the N-type ions and the P ions doped in the polysilicon are effectively neutralized mutually, so that the post-value resistance of the ion-doped polysilicon is of an order of 10E4, which effectively increases the post-value resistance value of the polysilicon and improves the programming current window. At the same time, since the polysilicon is doped with two different types of ion implantations, the internal grain size is small, and an interface between the subsequently formed metal salicide and the polysilicon is flat and uniform.

As described above, the electric fuse can be generally arranged in a redundant circuit of the integrated circuit on the substrate provided in the present disclosure, not only can the electric fuse structure provided in the present disclosure be formed, but also can the remaining CMOS structure be included.

In some embodiments, the manufacturing process for the CMOS structure needs to include a source-drain ion implantation process, and the source-drain ion implantation described above is also different for different types of CMOS. However, in the manufacturing method provided in the present disclosure, the concentration of ion doping on the polysilicon is equivalent to the concentration of source-drain ion implantation in the process of manufacturing the CMOS structure. Therefore, the N-type ion implantation performed on the polysilicon in the present disclosure and the N-type source-drain ion implantation of the CMOS can be completed in the same process step. Likewise, the P-type ion implantation performed on the polysilicon of the present disclosure and the P-type source-drain ion implantation of the CMOS can be completed in the same process step.

The method for manufacturing an electric fuse provided in the present disclosure is compatible with a manufacturing process for a logic CMOS device in terms of the ion implantation process, and although ion implantations of different types are required to be performed twice on the polysilicon of the electric fuse structure, there is no need to add an additional number of mask, only the region of the electric fuse structure is required to be simultaneously set to be an open implantation region in the step of processing the source-drain ion implantation of the CMOS device, so as to complete the polysilicon doping, which is universal and meets the actual manufacturing requirements.

After performing two types of ion implantations on the polysilicon, step S105 is performed to form a metal salicide on the surface of the doped polysilicon. As described above, since the doped polysilicon has a smaller grain size than that of the undoped polysilicon, the interface between the metal salicide, which is formed on the surface of the doped polysilicon, and the polysilicon is flat, smooth, and uniform. In one embodiment, the metal salicide is formed on the surface of the polysilicon using a self-aligned salicide process. In some embodiments, the method for forming metal salicide described above includes, but is not limited to, the self-aligned salicide.

After the metal salicide is formed, the method provided in the present disclosure further includes manufacturing contact holes corresponding to a anode and a cathode of the electric fuse to electrically extract the anode and the cathode of the electric fuse. It can be seen from the schematic diagram as shown in FIG. 4 that the anode 321 and the cathode 322 can each include more than one contact hole 330, and the contact holes 330 are filled with a conductive medium and is electrically connected to the metal salicide to extract the anode and cathode of the electric fuse. In some embodiments, the contact holes 330 in the present disclosure may be formed using the existing or future contact hole manufacturing process.

The present disclosure further provides an electric fuse structure manufactured by means of the above method, which can ensure that the post-value resistance of the electric fuse after programming is in a high resistance value range, and effectively optimize the fuse programming current window, moreover, the internal interface of the electric fuse structure is flat, smooth, and uniform, thereby effectively improving the reliability of the fuse, and then improving the product yield.

Heretofore, embodiments of an electric fuse structure capable of optimizing a programming current window and a manufacturing process therefor have been described. Although the present disclosure has been described with respect to certain exemplary embodiments, it will be apparent that various modifications and changes may be made to these embodiments without departing from the more general spirit and scope of the disclosure. Accordingly, the specification and the accompanying drawings are to be regarded in an illustrative rather than a restrictive sense.

It is to be understood that this description is not intended to explain or limit the scope or meaning of the claims. In addition, in the detailed description above, it can be seen that various features are combined together in a single embodiment for the purpose of simplifying the disclosure. The method of the present disclosure should not be interpreted as reflecting the intention that the claimed embodiments require more features than those expressly listed in each claim. Rather, as reflected by the appended claims, an inventive subject matter lies in being less than all features of a single disclosed embodiment. Therefore, the appended claims are hereby incorporated into the detailed description, with each claim standing on its own as a separate embodiment.

One embodiment or embodiments mentioned in this description is/are intended to be, combined with a particular feature, structure, or characteristic described in the embodiment, included in at least one embodiment of a circuit or method. The appearances of phrases in various places in the specification are not necessarily all referring to a same embodiment.

What is claimed is:

1. A manufacturing method for an electric fuse structure, comprising:
   providing a substrate;
   forming a polysilicon corresponding to the electric fuse structure on the substrate;
   performing a source-drain ion implantation of a first doping type on the polysilicon;
   performing a source-drain ion implantation of a second doping type on the polysilicon, the first doping type being different from the second doping type; and
   forming a metal salicide on the surface of the doped polysilicon;
   wherein the electric fuse structure comprises an anode, a cathode, and an electric fuse body connecting the anode and the cathode, the step of said forming the polysilicon further comprising:
   depositing a polysilicon layer on the surface of the substrate;
   patterning the polysilicon layer corresponding to the anode, the cathode, and the electric fuse body; and
   etching the patterned polysilicon layer to form the polysilicon corresponding to the electric fuse structure.

2. The manufacturing method of claim 1, wherein a concentration of the source-drain ion implantation of the first doping type is equivalent to a concentration of the source-drain ion implantation of the second doping type, so as to neutralize the source-drain ion implantations of the first doping type and the second doping type.

3. The manufacturing method of claim 2, wherein the concentration of the source-drain ion implantation of the first doping type and the concentration of the source-drain ion implantation of the second doping type are both in the range of 10E14-10E15.

4. The manufacturing method of claim 1, wherein the first doping type is an N-type and the second doping type is a P-type.

5. The manufacturing method of claim 1, wherein the first doping type is a P-type and the second doping type is an N-type.

6. The manufacturing method of claim 1, wherein a CMOS structure is also formed on the substrate, the CMOS structure being located on the substrate outside an area of the electric fuse structure;
   wherein the source-drain ion implantation of the first doping type is implanted in the same step as that of a source-drain ion implantation of the first doping type of the CMOS structure; and
   wherein the source-drain ion implantation of the second doping type is implanted in the same step as that of a source-drain ion implantation of the second doping type of the CMOS structure.

7. The manufacturing method of claim 1, further comprising:
   forming a shallow trench isolation on the substrate, wherein
   the polysilicon is formed on the shallow trench isolation.

8. The manufacturing method of claim 1, wherein the manufacturing method further comprises: forming several contact holes in the anode and the cathode, respectively.

9. The manufacturing method of claim 1, wherein the metal salicide is formed on the surface of the polysilicon using a self-aligned salicide process.

10. An electric fuse structure comprising:
    a substrate;
    a polysilicon corresponding to the electric fuse structure formed on the substrate, wherein a source-drain ion implantation of a first doping type is performed on the polysilicon, and wherein a source-drain ion implantation of a second doping type is performed on the polysilicon, wherein the first doping type being different from the second doping type; and
    a metal salicide formed on the surface of the doped polysilicon;
    wherein the electric fuse structure comprises an anode, a cathode, and an electric fuse body connecting the anode and the cathode;
    wherein the polysilicon is formed by following steps:
    a polysilicon layer deposited on the surface of the substrate;

the polysilicon layer patterned corresponding to the anode, the cathode, and the electric fuse body; and the patterned polysilicon layer etched to form the polysilicon corresponding to the electric fuse structure.

11. The electric fuse structure of claim 10, wherein a concentration of the source-drain ion implantation of the first doping type is equivalent to a concentration of the source-drain ion implantation of the second doping type, so as to neutralize the source-drain ion implantations of the first doping type and the second doping type.

12. The electric fuse structure of claim 10, wherein the concentration of the source-drain ion implantation of the first doping type and the concentration of the source-drain ion implantation of the second doping type are both in the range of 10E14-10E15.

13. The electric fuse structure of claim 10, wherein the first doping type is an N-type and the second doping type is a P-type.

14. The electric fuse structure of claim 10, wherein the first doping type is a P-type and the second doping type is an N-type.

15. The electric fuse structure of claim 10, further comprising a CMOS structure formed on the substrate, wherein the CMOS structure being located on the substrate outside an area of the electric fuse structure;

wherein the source-drain ion implantation of the first doping type is implanted in the same step as that of a source-drain ion implantation of the first doping type of the CMOS structure; and source-drain ions of the second doping type are implanted in the same step as that of source-drain ions of the second doping type of the CMOS structure.

16. The electric fuse structure of claim 10, further comprising a shallow trench isolation formed on the substrate, wherein the polysilicon is formed on the shallow trench isolation.

17. The electric fuse structure of claim 10, wherein several contact holes are formed in the anode and the cathode, respectively.

18. The electric fuse structure of claim 10, wherein the metal salicide is formed on the surface of the polysilicon using a self-aligned salicide process.

* * * * *